United States Patent
Kim et al.

(10) Patent No.: US 9,059,357 B2
(45) Date of Patent: Jun. 16, 2015

(54) BIFACIAL SOLAR CELL

(75) Inventors: Sungjin Kim, Seoul (KR); Haejong Cho, Seoul (KR); Yangwoo Byun, Seoul (KR); Seongeun Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 290 days.

(21) Appl. No.: 13/478,393

(22) Filed: May 23, 2012

(65) Prior Publication Data

US 2013/0186459 A1    Jul. 25, 2013

(30) Foreign Application Priority Data

Jan. 20, 2012    (KR) ........................ 10-2012-0006525

(51) Int. Cl.
*H01L 31/0224*    (2006.01)
*H01L 31/0236*    (2006.01)
*H01L 31/068*    (2012.01)
*H01L 31/18*    (2006.01)

(52) U.S. Cl.
CPC .... *H01L 31/0684* (2013.01); *H01L 31/022425* (2013.01); *H01L 31/1804* (2013.01); *Y02E 10/547* (2013.01)

(58) Field of Classification Search
USPC .................................. 136/244, 252, 261, 265
See application file for complete search history.

(56) References Cited

U.S. PATENT DOCUMENTS

| 6,479,744 B1 * | 11/2002 | Tsuzuki et al. ............... 136/256 |
| 2011/0192457 A1 * | 8/2011 | Nakayama et al. ........... 136/256 |
| 2012/0171805 A1 | 7/2012 | Hu et al. |

FOREIGN PATENT DOCUMENTS

| CN | 102163649 A | 8/2011 |
| JP | 8-148447 A | 6/1996 |
| JP | 2011-211080 A | 10/2011 |

OTHER PUBLICATIONS

Lago et al., "Screen printing metallization of boron emitters," Progress in Photovoliaics: Research and Applications, vol. 18, No. 1, Jan. 1, 2010, pp. 20-27.
Mikhitaryan et al., "Thick Film Contact Paste for Silicon Solar Cells with B-Doped Emitter," Proceedings of the 23rd European Photovoltaic Solar Energy Conference, Sep. 1-5, 2008, pp. 1364-1366.
Schubert, "Thick Film Metallisation of Crystalline Silicon Solar Cells," Mechanisms, Models and Applications, Aug. 9, 2006, XP002571398, 148 pages.

* cited by examiner

*Primary Examiner* — Susan D Leong
(74) *Attorney, Agent, or Firm* — Birch, Stewart, Kolasch & Birch, LLP

(57) ABSTRACT

A bifacial solar cell is discussed. The bifacial solar cell includes a substrate, a $p^+$-type doped region positioned at a first surface of the substrate, a P-type electrode part electrically connected to the $p^+$-type doped region, an $n^+$-type doped region positioned at a second surface of the substrate, and an N-type electrode part electrically connected to the $n^+$-type doped region. The P-type electrode part is formed of a first inorganic solid powder including a first powder, which contains silver (Ag) and has an average diameter of about 0.2 μm to 1 μm, and a second powder, which contains a group III element and has an average diameter of about 1 μm to 5 μm. The N-type electrode part is formed of a second inorganic solid powder including only the first powder.

19 Claims, 2 Drawing Sheets

BIFACIAL SOLAR CELL

This application claims priority to and the benefit of Korean Patent Application No. 10-2012-0006525 filed in the Korean Intellectual Property Office on Jan. 20, 2012, the entire contents of which are incorporated herein by reference.

BACKGROUND OF THE INVENTION

1. Field of the Invention

Embodiments of the invention relate to a bifacial solar cell.

2. Description of the Related Art

Solar power generation to convert light energy into electric energy using a photoelectric conversion effect has been widely used as a method for obtaining eco-friendly energy. A solar power generation system using a plurality of solar cell modules has been installed in places, such as houses, due to an improvement of a photoelectric conversion efficiency of solar cells.

A solar cell generally includes a substrate and an emitter region forming a p-n junction along with the substrate. The solar cell generates an electric current using light incident through one surface of the substrate.

An anti-reflection layer is formed on a light receiving surface of the substrate, so as to reduce a reflectance of light incident on the substrate and increase a transmittance of light of a predetermined wavelength band. Hence, the anti-reflection layer increases a photoelectric conversion efficiency of the solar cell.

Because light is generally incident only on one surface of the substrate of the solar cell, a current conversion efficiency of the solar cell is low.

Accordingly, a bifacial solar cell, in which light is incident on both surfaces of the substrate, has been recently developed.

SUMMARY OF THE INVENTION

In one aspect, there is a bifacial solar cell including a substrate, a $p^+$-type doped region positioned at a first surface of the substrate, a P-type electrode part electrically connected to the $p^+$-type doped region, an $n^+$-type doped region positioned at a second surface of the substrate, and an N-type electrode part electrically connected to the $n^+$-type doped region, wherein the P-type electrode part is formed of a first inorganic solid powder including a first powder, which contains silver (Ag) and has an average diameter of about 0.2 μm to 1 μm, and a second powder, which contains a group III element and has an average diameter of about 1 μm to 5 μm, and wherein the N-type electrode part is formed of a second inorganic solid powder including only the first powder.

Each of the first inorganic solid powder and the second inorganic solid powder may further include a glass frit. The glass frit may include at least one of an oxide of lead (Pb), silicon (Si), sulfur (B), aluminum (Al), and zinc (Zn).

The glass frit may include about 70 wt % to 85 wt % of PbO based on a total weight of the glass frit.

The first inorganic solid powder may include about 86 wt % to 95 wt % of the first powder and about 1 wt % to 5 wt % of the second powder based on a total weight of the first inorganic solid powder.

The second powder may be an aluminum-containing powder.

The $p^+$-type doped region may serves as an emitter region, and the $n^+$-type doped region may serve as a back surface field (BSF) region.

At least one of an anti-reflection layer and a passivation layer may be formed on the emitter region, on which the P-type electrode part is not positioned, and on the back surface field region, on which the N-type electrode part is not positioned.

The P-type electrode part may include a plurality of first finger electrodes and a plurality of first bus bar electrodes crossing the plurality of first finger electrodes. The N-type electrode part may include a greater number of a plurality of second finger electrodes than the number of the plurality of first finger electrodes of the P-type electrode part, and a plurality of second bus bar electrodes having the same number as the plurality of first bus bar electrodes of the P-type electrode part. The plurality of first bus bar electrodes of the P-type electrode part and the plurality of second bus bar electrodes of the N-type electrode part may be formed at opposing locations of the substrate.

As another example of the bifacial solar cell, the $p^+$-type doped region may serve as a back surface field (BSF) region, and the $n^+$-type doped region may serve as an emitter region.

At least one of an anti-reflection layer and a passivation layer may be formed on the back surface field region, on which the P-type electrode part is not positioned, and on the emitter region, on which the N-type electrode part is not positioned.

The N-type electrode part may include a plurality of second finger electrodes and a plurality of second bus bar electrodes crossing the plurality of second finger electrodes. The P-type electrode part may include a greater number of a plurality of first finger electrodes than the number of the plurality of second finger electrodes of the N-type electrode part, and a plurality of first bus bar electrodes having the same number as the plurality of second bus bar electrodes of the N-type electrode part. The plurality of first bus bar electrodes of the N-type electrode part and the plurality of first bus bar electrodes of the P-type electrode part may be formed at opposite locations of the substrate.

According to the above-described characteristics, the first inorganic solid powder forming the P-type electrode part electrically connected to the $p^+$-type doped region further includes the second powder, for example, the aluminum-containing powder containing the group III element, in addition to the first powder containing silver (Ag).

Thus, contact characteristic between the P-type electrode part and the $p^+$-type doped region is improved because of the second powder, and adhesive characteristic between the P-type electrode part and an interconnector is improved because of the first powder.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
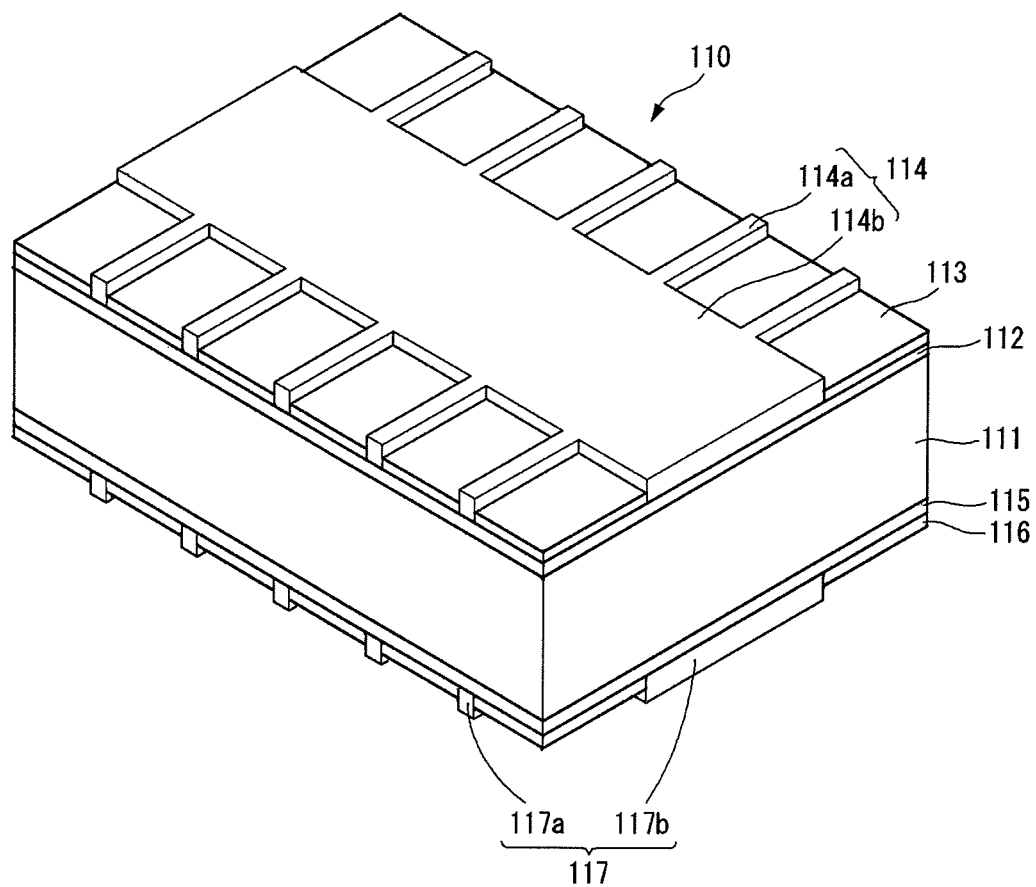
FIG. 1 is a perspective view of a main part of a bifacial solar cell according to an example embodiment of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be noted that a detailed description of known arts will be omitted if it is determined that the known arts can obscure the embodiments of the invention.

In the drawings, the thickness of layers, films, panels, regions, etc., are exaggerated for clarity. It will be understood that when an element such as a layer, film, region, or substrate is referred to as being "on" another element, it can be directly on the another element or intervening elements may also be present. In contrast, when an element is referred to as being "directly on" another element, there are no intervening elements present.

Further, it will be understood that when an element such as a layer, film, region, or substrate is referred to as being "entirely" on another element, it may be on the entire surface of the another element and may not be on a portion of an edge of the another element.

Example embodiments of the invention will be described in detail with reference to FIGS. 1 and 2.

A bifacial solar cell module includes a plurality of bifacial solar cells 110, an interconnector for electrically connecting the bifacial solar cells 110, which are arranged adjacent to each other in a column direction, front and back protective layers for protecting the bifacial solar cells 110, a light transmission front substrate positioned on the front protective layer on front surfaces of the bifacial solar cells 110, and a light transmission back substrate positioned on a back surface of the back protective layer on back surfaces of the bifacial solar cells 110.

The bifacial solar cell module further includes a frame receiving the above-described components, which form an integral body through a lamination process, and a junction box for collecting electric power produced by the bifacial solar cells 110.

The light transmission front substrate and the light transmission back substrate prevent moisture or oxygen from penetrating from the outside of the bifacial solar cell module, thereby protecting the bifacial solar cells 110 from an external environment.

The light transmission front substrate and the light transmission back substrate are formed of a tempered glass having a high light transmittance and excellent damage prevention characteristics. The tempered glass may be a low iron tempered glass containing a small amount of iron.

The light transmission front substrate and the light transmission back substrate may have an embossed inner surface so as to increase a scattering effect of light.

Other transparent materials may be used as the light transmission front substrate and the light transmission back substrate. Accordingly, the light transmission front substrate and the light transmission back substrate may be formed of a polymer resin. In the embodiment of the invention, the polymer resin may use polyethylene terephthalate (PET).

The front and back protective layers and the bifacial solar cells 110 form an integral body when the lamination process is performed in a state where the front and back protective layers are respectively positioned on the front surfaces and the back surfaces of the bifacial solar cells 110. The front and back protective layers prevent corrosion of metal resulting from the moisture penetration and protect the bifacial solar cells 110 from an impact.

The front and back protective layers may be formed of ethylene vinyl acetate (EVA) or silicon resin. Other materials may be used.

As shown in FIG. 1, the bifacial solar cell 110 according to the embodiment of the invention includes a substrate 111 of a first conductive type, for example, an n-type, a second conductive type doped region 112 (a $p^+$-type doped region 112) which is positioned at a first surface, for example, a front surface of the substrate 111 and serves as an emitter region, a front anti-reflection layer 113 positioned on the $p^+$-type doped region 112, a P-type electrode part 114 positioned on the $p^+$-type doped region 112 on which the front anti-reflection layer 113 is not positioned, an $n^+$-type doped region 115 which is positioned at a second surface, for example, a back surface of the substrate 111 and serves as a back surface field (BSF) region, a back anti-reflection layer 116 positioned on a back surface of the $n^+$-type doped region 115, an N-type electrode part 117 positioned on the back surface of the $n^+$-type doped region 115 on which the back anti-reflection layer 116 is not positioned.

The substrate 111 is formed of an n-type silicon wafer. Silicon used in the n-type silicon wafer may be single crystal silicon, polycrystalline silicon, or amorphous silicon.

Because the substrate 111 is of the n-type in the embodiment of the invention, the substrate 111 contains impurities of a group V element such as phosphorus (P), arsenic (As), and antimony (Sb).

The $p^+$-type doped region 112 positioned at the front surface of the substrate 111 is an impurity region of the second conductive type (for example, p-type) opposite the first conductive type (for example, n-type) of the substrate 111. Thus, the $p^+$-type doped region 112 forms a p-n junction along with the substrate 111.

The $p^+$-type doped region 112 is formed by doping p-type impurities, for example, impurities of a group III element such as boron (B), gallium (Ga), and indium (In) on the first surface of the substrate 111 at a constant doping concentration. Thus, in the embodiment of the invention, the doping concentration of the $p^+$-type doped region 112 is constant.

Electron-hole pairs produced by light incident on the substrate 111 are separated into electrons and holes (i.e., carriers) by a built-in potential difference resulting from the p-n junction between the substrate 111 and the $p^+$-type doped region 112. Then, the separated electrons move to the n-type semiconductor, and the separated holes move to the p-type semiconductor.

Thus, the separated electrons move to the substrate 111, and the separated holes move to the $p^+$-type doped region 112. Hence, the electrons become major carriers in the substrate 111, and the holes become major carriers in the $p^+$-type doped region 112.

The front anti-reflection layer 113 positioned on the $p^+$-type doped region 112 is formed of an oxide or a nitride, for example, at least one selected among silicon nitride (SiNx), silicon oxide (SiOx), aluminum oxide (AlOx), and titanium dioxide ($TiO_2$).

The front anti-reflection layer 113 performs an anti-reflection function to reduce a reflectance of light incident through the front surface of the substrate 111 and to increase selectivity of a predetermined wavelength band. In addition, the front anti-reflection layer 113 may perform a passivation function.

The P-type electrode part 114 is positioned on the $p^+$-type doped region 112, on which the front anti-reflection layer 113 is not positioned.

The P-type electrode part 114 may include a plurality of finger electrodes 114a and a plurality of bus bar electrodes 114b.

The P-type electrode part 114 is formed by printing and firing an electrode paste including a first inorganic solid powder.

The electrode paste forming the P-type electrode part 114 includes about 7 wt % to 9 wt % of a solvent, about 86 wt % to 90 wt % of a first inorganic solid powder, and about 1 wt % to 3 wt % of an organic material.

The first inorganic solid powder includes a first powder containing silver (Ag), a second powder containing a group III element, for example, aluminum (Al), and a glass frit.

It is preferable, but not required, that the Ag-containing first powder has an average diameter $D_{50}$ of about 0.2 μm to 1 μm. When the average diameter $D_{50}$ of the Ag-containing first powder is less than about 0.2 μm, a non-surface area of the first powder increases. Hence, a viscosity of a composition of the electrode paste increases, and printing characteristics of the electrode paste are reduced. Further, when the average diameter $D_{50}$ of the Ag-containing first powder is greater than about 1 μm, a density of the first powder in the electrode paste is reduced. Hence, many voids are generated in wires after a firing process, and a wire resistance increases.

In the embodiment of the invention, it is preferable, but not required, that the first inorganic solid powder includes about 86 wt % to 95 wt % of the first powder based on the total weight of the first inorganic solid powder. When an amount of the first powder is less than about 86 wt %, a wiring layer printed after the firing process becomes thin. Hence, the wire resistance increases, and soldering characteristics are reduced. Further, when an amount of the first powder is greater than about 95 wt %, a printing thickness greatly increases. Hence, the bending of the substrate may be generated.

In the embodiment of the invention, the first powder has a sphere shape or a plate-like shape.

It is preferable, but not required, that the Al-containing second powder has an average diameter $D_{50}$ of about 1 μm to 5 μm. Further, it is preferable, but not required, that the first inorganic solid powder includes about 1 wt % to 5 wt % of the second powder based on the total weight of the first inorganic solid powder. When an amount of the second powder is less than about 1 wt %, contact characteristic between the P-type electrode part 114 and the $p^+$-type doped region 112 is not efficiently improved. When an amount of the second powder is greater than about 5 wt %, adhesive characteristic between the P-type electrode part 114 and the interconnector is reduced.

The glass frit includes oxides of lead (Pb), silicon (Si), sulfur (B), aluminum (Al), zinc (Zn), etc. For example, $Bi_2O_3$—$Al_2O_3$—$SiO_2$—$SrO$—$B_2O_3$ may be used as the glass frit. A composition ratio of the glass frit is not particularly limited. However, the glass frit may include about 70 wt % to 85 wt % of PbO based on the total weight of the glass frit.

The organic material of the electrode paste forming the P-type electrode part 114 includes a binder and an additive.

In the embodiment of the invention, ethyl cellulose, polyamide, hydrogenated rosin, etc., may be used as the binder. Other materials may be used for the binder.

A dispersing agent, a wetting agent, etc., may be used as the additive, if necessary or desired.

In the embodiment of the invention, butyl carbitol, diethylene glycol monobutyl ether, diethylene glycol monobutyl ether acetate, etc., may be used as the solvent of the electrode paste. Other materials may be used for the solvent.

The electrode paste for the P-type electrode part 114 is printed on the front surface of the substrate 111 through a printing process, and the front anti-reflection layer 113 is removed by an etching component (i.e., Pb) contained in the glass fit of the electrode paste during the firing process. Hence, the P-type electrode part 114 may be electrically connected to the $p^+$-type doped region 112.

As described above, the P-type electrode part 114 is formed using the first inorganic solid powder including the first powder containing silver (Ag) and the second powder containing the group III element in accordance with the above-described composition ratio. Thus, the contact characteristic between the P-type electrode part 114 and the $p^+$-type doped region 112 is improved because of the second powder of the same conductive type as the $p^+$-type doped region 112, and the adhesive characteristic between the P-type electrode part 114 and the interconnector is improved because of the Ag-containing first powder.

The P-type electrode part 114 collects carriers (for example, holes) moving to the $p^+$-type doped region 112.

The N-type electrode part 117 positioned on the back surface of the substrate 111 collects carriers (for example, electrons) moving to the substrate 111 and outputs the carriers to an external device.

In the embodiment of the invention, the N-type electrode part 117 includes a plurality of finger electrodes 117a corresponding to the finger electrodes 114a of the P-type electrode part 114 and a plurality of bus bar electrodes 117b corresponding to the bus bar electrodes 114b of the P-type electrode part 114.

It is preferable, but not required, that the number of finger electrodes 117a of the N-type electrode part 117 is more than the number of finger electrodes 114a of the P-type electrode part 114.

An electrode paste forming the N-type electrode part 117 may be substantially the same as the electrode paste forming the P-type electrode part 114, except that the electrode paste of the N-type electrode part 117 includes a second inorganic solid powder obtained by removing the second powder from the first inorganic solid powder of the P-type electrode part 114. In other words, the second inorganic solid powder does not include a powder of a group III element, for example, an aluminum (Al) powder, and thus the N-type electrode part 117 includes not the aluminum powder but aluminum oxide.

Alternatively, the N-type electrode part 117 may be formed using an electrode paste (not containing the second power) generally used to form the N-type electrode part.

The $n^+$-type doped region 115 electrically and physically connected to the N-type electrode part 117 is positioned at the entire back surface of the substrate 111. The $n^+$-type doped region 115 forms a potential barrier by a difference between impurity concentrations of the substrate 111 and the $n^+$-type doped region 115, thereby preventing or reducing the movement of holes to the back surface of the substrate 111. Hence, a recombination and/or a disappearance of electrons and holes around the back surface of the substrate 111 are prevented or reduced.

The back anti-reflection layer 116 is positioned on the back surface of the $n^+$-type doped region 115, on which the N-type electrode part 117 is not positioned. The back anti-reflection layer 116 is formed of an oxide or a nitride, for example, at least one selected among silicon nitride (SiNx), silicon oxide (SiOx), aluminum oxide (AlOx), and titanium dioxide ($TiO_2$), in the same manner as the front anti-reflection layer 113.

A passivation layer may be formed between the front anti-reflection layer 113 and the p$^+$-type doped region 112 and between the back anti-reflection layer 116 and the n$^+$-type doped region 115.

When light irradiated onto the bifacial solar cell 110 is incident on the substrate 111 through the p$^+$-type doped region 112 and the n$^+$-type doped region 115, a plurality of electron-hole pairs are generated in the substrate 111 by light energy produced by the light incident on the substrate 111.

Because a reflection loss of light incident on the substrate 111 is reduced by the front anti-reflection layer 113 and the back anti-reflection layer 116, an amount of light incident on the substrate 111 further increases.

The electron-hole pairs are separated into electrons and holes by the p-n junction between the substrate 111 and the p$^+$-type doped region 112. Then, the separated electrons move to the n-type substrate 111, and the separated holes move to the p$^+$-type doped region 112.

The electrons moving to the substrate 111 move to the N-type electrode part 117 through the n$^+$-type doped region 115, and the holes moving to the p$^+$-type doped region 112 move to the P-type electrode part 114.

Accordingly, when the P-type electrode part 114 of one bifacial solar cell is connected to the N-type electrode part 117 of another bifacial solar cell adjacent to the one bifacial solar cell using electric wires, for example, the interconnector, electric current flows through the bifacial solar cells and allows use of the electric current for electric power.

Figure 2:
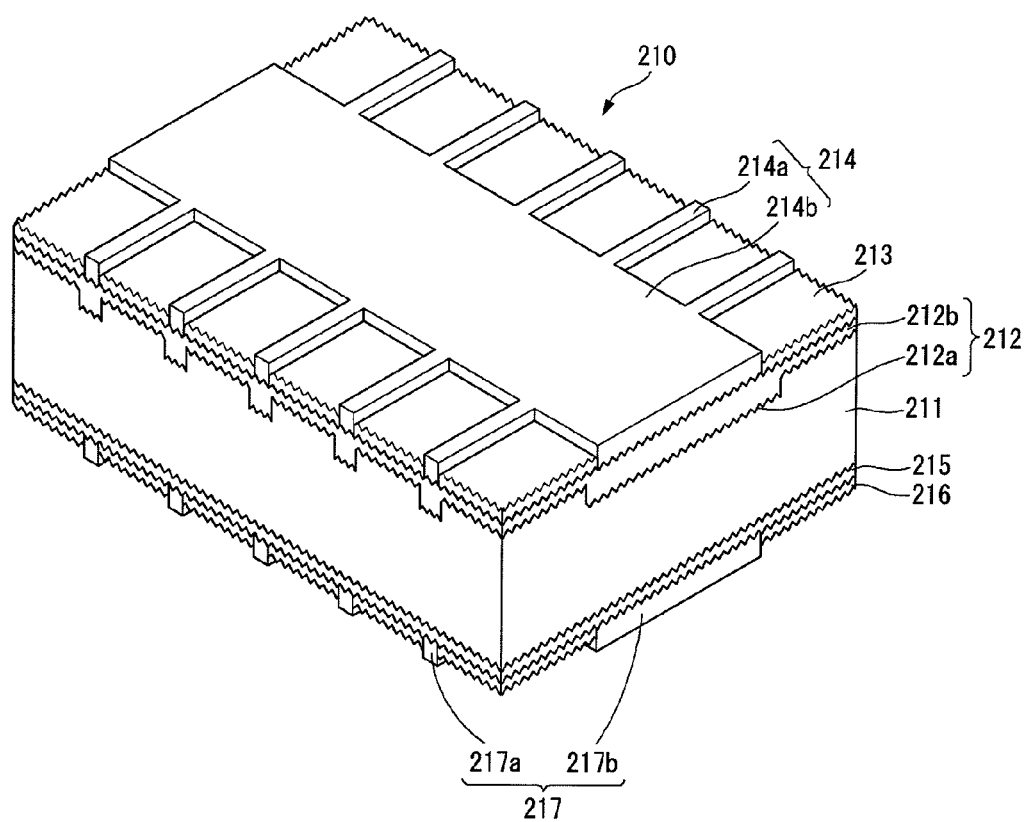
FIG. 2 is a perspective view of a main part of a bifacial solar cell according to another example embodiment of the invention.

FIG. 2 is a perspective view of a main part of a bifacial solar cell according to another example embodiment of the invention.

A bifacial solar cell 210 according to the embodiment of the invention includes a substrate 211 of a second conductive type, for example, a p-type, a first conductive type doped region 212 (an n$^+$-type doped region 212) which is positioned at a first surface, for example, a front surface of the substrate 211 and serves as a selective emitter region, a front anti-reflection layer 213 positioned on the n$^+$-type doped region 212, an N-type electrode part 214 positioned on the n$^+$-type doped region 212 on which the front anti-reflection layer 213 is not positioned, a p$^+$-type doped region 215 which is positioned at a second surface, for example, a back surface of the substrate 211 and serves as a back surface field (BSF) region, a back anti-reflection layer 216 positioned on a back surface of the p$^+$-type doped region 215, a P-type electrode part 217 positioned on the back surface of the p$^+$-type doped region 215 on which the back anti-reflection layer 216 is not positioned.

The substrate 211 is formed of a p-type silicon wafer. Silicon used in the p-type silicon wafer may be single crystal silicon, polycrystalline silicon, or amorphous silicon.

Because the substrate 211 is of the p-type in the embodiment of the invention, the substrate 211 contains impurities of a group III element such as boron (B), gallium (Ga), and indium (In).

At least one of the front surface and the back surface of the substrate 211 may be textured, so as to reduce a light reflectance in the front surface and the back surface of the substrate 211 and to increase a light absorptance in the front surface and the back surface of the substrate 211.

The n$^+$-type doped region 212 positioned at the front surface of the substrate 211 is an impurity region of the first conductive type (for example, n-type) opposite the conductive type (i.e., the p-type) of the substrate 211, and thus forms a p-n junction along with the substrate 211.

The n$^+$-type doped region 212 is formed by doping the n-type impurities, for example, impurities of a group V element such as phosphorus (P), arsenic (As), and antimony (Sb) on the first surface of the substrate 211.

The efficiency of the solar cell is generally affected by a concentration of impurities doped on the emitter region. For example, when the emitter region is doped with impurities of a low concentration (i.e., when the emitter region is a lightly doped region), a recombination of electrons and holes is reduced. Hence, a short circuit current density and an open-circuit voltage may increase. However, a reduction in a fill factor may be caused because of an increase in a contact resistance.

Further, when the emitter region is doped with impurities of a high concentration (i.e., when the emitter region is a heavily doped region), the contact resistance may decrease and the fill factor may increase. However, the short circuit current density and the open-circuit voltage may decrease.

Thus, the selective emitter region capable of obtaining advantages of both the lightly doped region and the heavily doped region was developed. In the embodiment of the invention, the n$^+$-type doped region 212 serving as the selective emitter region includes a heavily doped region 212a and a lightly doped region 212b. The heavily doped region 212a and the lightly doped region 212b are formed at different doping concentrations.

For example, the heavily doped region 212a is formed by doping impurities at a concentration higher than the lightly doped region 212b. Thus, a doping concentration of the n$^+$-type doped region 212 shown in FIG. 2 is not uniform, unlike the p$^+$-type doped region 112 shown in FIG. 1.

In the n$^+$-type doped region 212 having the above-described configuration, a thickness of the heavily doped region 212a is greater than a thickness of the lightly doped region 212b. The n$^+$-type doped region 212 serving as the selective emitter region may be formed through a method using a laser ablation, or a method using a mask, etc.

Because the doping concentration of the heavily doped region 212a is higher than the doping concentration of the lightly doped region 212b, a sheet resistance of the heavily doped region 212a is less than a sheet resistance of the lightly doped region 212b. Thus, the N-type electrode part 214 is electrically connected to the heavily doped region 212a of the n$^+$-type doped region 212, so as to improve a carrier transfer efficiency.

Electron-hole pairs produced by light incident on the substrate 211 are separated into electrons and holes (i.e., carriers). Then, the separated electrons move to the n-type semiconductor, and the separated holes move to the p-type semiconductor.

Thus, the separated electrons move to the n$^+$-type doped region 212, and the separated holes move to the substrate 211. Hence, the holes become major carriers in the substrate 211, and the electrons become major carriers in the n$^+$-type doped region 212.

The front anti-reflection layer 213 positioned on the n$^+$-type doped region 212 is formed of an oxide or a nitride, for example, at least one selected among silicon nitride (SiNx), silicon oxide (SiOx), aluminum oxide (AlOx), and titanium dioxide (TiO$_2$).

The front anti-reflection layer 213 performs an anti-reflection function to reduce a reflectance of light incident through the front surface of the substrate 211 and to increase selectivity of a predetermined wavelength band. In addition, the front anti-reflection layer 213 may perform a passivation function. The N-type electrode part 214 is positioned on the n$^+$-type doped region 212, on which the front anti-reflection layer 213 is not positioned.

The N-type electrode part 214 may include a plurality of finger electrodes 214a and a plurality of bus bar electrodes 214b. The N-type electrode part 214 may be formed using the same electrode paste as the N-type electrode part 117 shown in FIG. 1.

The N-type electrode part 214 collects carriers (for example, electrons) moving to the $n^+$-type doped region 212. The P-type electrode part 217 positioned on the back surface of the substrate 211 collects carriers (for example, holes) moving to the substrate 211 and outputs the carriers to an external device.

In the embodiment of the invention, the P-type electrode part 217 includes a plurality of finger electrodes 217a corresponding to the finger electrodes 214a of the N-type electrode part 214 and a plurality of bus bar electrodes 217b corresponding to the bus bar electrodes 214b of the N-type electrode part 214.

It is preferable, but not required, that the number of finger electrodes 217a of the P-type electrode part 217 is more than the number of finger electrodes 114a of the N-type electrode part 214. In the embodiment of the invention, the P-type electrode part 217 may be formed using the same electrode paste as the P-type electrode part 114 shown in FIG. 1.

The $p^+$-type doped region 215 electrically and physically connected to the P-type electrode part 217 is positioned at the entire back surface of the substrate 211. The $p^+$-type doped region 215 forms a potential barrier by a difference between impurity concentrations of the substrate 211 and the $p^+$-type doped region 215, thereby preventing or reducing the movement of electrons to the back surface of the substrate 211. Hence, a recombination and/or a disappearance of electrons and holes around the surface of the substrate 211 are prevented or reduced.

The back anti-reflection layer 216 is positioned on the back surface of the $p^+$-type doped region 215, on which the P-type electrode part 217 is not positioned. The back anti-reflection layer 216 is formed of an oxide or a nitride, for example, at least one selected among silicon nitride (SiNx), silicon oxide (SiOx), aluminum oxide (AlOx), and titanium dioxide ($TiO_2$), in the same manner as the front anti-reflection layer 213.

A passivation layer may be formed between the front anti-reflection layer 213 and the $n^+$-type doped region 212 and between the back anti-reflection layer 216 and the $p^+$-type doped region 215.

When light irradiated onto the bifacial solar cell 210 is incident on the substrate 211 through the $n^+$-type doped region 212 serving as the selective emitter region and the $p^+$-type doped region 215 serving as the BSF region, a plurality of electron-hole pairs are generated in the substrate 211 by light energy produced by the light incident on the substrate 211.

Because the front surface and/or the back surface of the substrate 211 are the textured surface, the light reflectance in the front surface and the back surface of the substrate 211 is reduced. Further, because both a light incident operation and a light reflection operation are performed on the textured surface of the substrate 211, light is confined in the bifacial solar cell 210. Hence, the light absorption increases, and the efficiency of the bifacial solar cell 210 is improved.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A bifacial solar cell comprising:
a substrate;
a $p^+$-type doped region positioned at a first surface of the substrate;
a P-type electrode part electrically connected to the $p^+$-type doped region;
an $n^+$-type doped region positioned at a second surface of the substrate; and
an N-type electrode part electrically connected to the $n^+$-type doped region,
wherein the P-type electrode part is formed of a first inorganic solid powder including a first powder, which contains silver (Ag) and has an average diameter of about 0.2 μm to 1 μm, and a second powder, which contains aluminum (Al) and has an average diameter of about 1 μm to 5 μm, and
wherein the N-type electrode part is formed of a second inorganic solid powder including only the first powder.

2. The bifacial solar cell of claim 1, wherein the first inorganic solid powder further includes a glass frit.

3. The bifacial solar cell of claim 2, wherein the glass frit includes at least one of an oxide of lead (Pb), silicon (Si), sulfur (B), aluminum (Al), and zinc (Zn).

4. The bifacial solar cell of claim 3, wherein the glass frit includes about 70 wt % to 85 wt % of PbO based on a total weight of the glass frit.

5. The bifacial solar cell of claim 2, wherein the first inorganic solid powder includes about 86 wt % to 95 wt % of the first powder and about 1 wt % to 5 wt % of the second powder based on a total weight of the first inorganic solid powder.

6. The bifacial solar cell of claim 1, wherein the $p^+$-type doped region serves as an emitter region, and the $n^+$-type doped region serves as a back surface field (BSF) region.

7. The bifacial solar cell of claim 6, wherein the substrate is an n-type.

8. The bifacial solar cell of claim 6, wherein at least one of an anti-reflection layer and a passivation layer is formed on the emitter region, on which the P-type electrode part is not positioned, and on the back surface field region, on which the N-type electrode part is not positioned.

9. The bifacial solar cell of claim 6, wherein the P-type electrode part includes a plurality of first finger electrodes and a plurality of first bus bar electrodes crossing the plurality of first finger electrodes,
wherein the N-type electrode part includes a greater number of a plurality of second finger electrodes than the number of the plurality of first finger electrodes of the P-type electrode part, and a plurality of second bus bar electrodes having the same number as the plurality of first bus bar electrodes of the P-type electrode part, and
wherein the plurality of first bus bar electrodes of the P-type electrode part and the plurality of second bus bar electrodes of the N-type electrode part are formed at opposite locations of the substrate.

10. The bifacial solar cell of claim 1, wherein the $p^+$-type doped region serves as a back surface field (BSF) region, and the $n^+$-type doped region serves as an emitter region.

11. The bifacial solar cell of claim 10, wherein the substrate is a p-type.

12. The bifacial solar cell of claim 10, wherein at least one of an anti-reflection layer and a passivation layer is formed on the back surface field region, on which the P-type electrode part is not positioned, and on the emitter region, on which the N-type electrode part is not positioned.

13. The bifacial solar cell of claim 10, wherein the N-type electrode part includes a plurality of second finger electrodes and a plurality of second bus bar electrodes crossing the plurality of second finger electrodes,
   wherein the P-type electrode part includes a greater number of a plurality of first finger electrodes than the number of the plurality of second finger electrodes of the N-type electrode part, and a plurality of first bus bar electrodes having the same number as the plurality of second bus bar electrodes of the N-type electrode part, and
   wherein the plurality of first bus bar electrodes of the N-type electrode part and the plurality of first bus bar electrodes of the P-type electrode part are formed at opposite locations of the substrate.

14. The bifacial solar cell of claim 10, wherein the emitter region includes a heavily doped region and a lightly doped region, the heavily doped region having a higher concentration of an impurity than that of the lightly doped region.

15. The bifacial solar cell of claim 14, wherein a thickness of the heavily doped region is greater than a thickness of the lightly doped region.

16. The bifacial solar cell of claim 15, wherein the N-type electrode part includes a plurality of finger electrodes and a plurality of bus bar electrodes crossing the plurality of finger electrodes, and
   the plurality of finger electrodes and the plurality of bus bar electrodes are formed over the heavily doped region.

17. The bifacial solar cell of claim 10, wherein the at least one of a front surface and a back surface of the substrate is textured.

18. The bifacial solar cell of claim 1, wherein an anti-reflection layer is formed on a front surface and a back surface of the substrate, and
   the anti-reflection layer is formed of an oxide or a nitride.

19. The bifacial solar cell of claim 18, wherein the anti-reflection layer is one of silicon nitride (SiNx), silicon oxide (SiOx), aluminum oxide (AlOx), and titanium dioxide ($TiO_2$).

* * * * *